United States Patent
Lu et al.

(10) Patent No.: US 11,756,790 B2
(45) Date of Patent: Sep. 12, 2023

(54) METHOD FOR PATTERNING A DIELECTRIC LAYER

(71) Applicant: Tokyo Electron Limited, Tokyo (JP)

(72) Inventors: Yen-Tien Lu, Albany, NY (US);
Xinghua Sun, Albany, NY (US);
Shihsheng Chang, Albany, NY (US);
Eric Chih-Fang Liu, Albany, NY (US);
Angelique Raley, Albany, NY (US);
Katie Lutker-Lee, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 118 days.

(21) Appl. No.: 17/196,385

(22) Filed: Mar. 9, 2021

(65) Prior Publication Data
US 2022/0293419 A1    Sep. 15, 2022

(51) Int. Cl.
*H01L 21/033* (2006.01)
*H01L 21/3065* (2006.01)
*H01L 21/308* (2006.01)

(52) U.S. Cl.
CPC ...... *H01L 21/0332* (2013.01); *H01L 21/3065* (2013.01); *H01L 21/3081* (2013.01)

(58) Field of Classification Search
None
See application file for complete search history.

(56) References Cited

U.S. PATENT DOCUMENTS

| 4,902,645 | A | 2/1990 | Ohba |
| 5,861,233 | A | 1/1999 | Sekine et al. |
| 10,049,913 | B2 | 8/2018 | Tapily |
| 10,068,764 | B2 | 9/2018 | Tapily et al. |
| 10,453,749 | B2 | 10/2019 | Tapily et al. |
| 2014/0051256 | A1 | 2/2014 | Zhong et al. |
| 2015/0125375 | A1* | 5/2015 | Zhou .............. C23C 14/3485 204/192.15 |
| 2016/0064275 | A1 | 3/2016 | Liu et al. |
| 2016/0379842 | A1 | 12/2016 | Kal et al. |
| 2017/0117195 | A1 | 4/2017 | Adderly et al. |
| 2017/0178899 | A1* | 6/2017 | Kabansky ........ H01L 21/02274 |
| 2020/0194272 | A1* | 6/2020 | Jain .................. H01L 21/31116 |
| 2022/0028697 | A1* | 1/2022 | Tan ................... H01L 21/67259 |

* cited by examiner

*Primary Examiner* — Stephanie P Duclair

(57) ABSTRACT

A method is described for patterning a dielectric layer disposed over a semiconductor substrate layer. The patterning process includes forming a patterned hard mask layer over the dielectric layer, the patterned hard mask layer exposing a portion of a major surface of the dielectric layer. A portion of the dielectric layer is removed by a cyclic etch process, where performing one cycle of the cyclic etch process comprises forming a capping layer selectively over the patterned hard mask layer and performing a timed etch process that removes material from the dielectric layer. In another method, the deposition over the hard mask and the removal of the portion of the dielectric layer are performed concurrently.

6 Claims, 7 Drawing Sheets

US 11,756,790 B2

METHOD FOR PATTERNING A DIELECTRIC LAYER

TECHNICAL FIELD

The present invention relates generally to a method for semiconductor processing, and, in particular embodiments, to a method for patterning a dielectric layer of a semiconductor substrate.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Starting from an unpatterned semiconductor wafer, a multilevel structure of interconnected components is fabricated that functions as an electronic system. At each patterning level, a pattern of actinic radiation is transferred onto a photoresist film, and then to other layers in the substrate using the patterned photoresist as an etch mask.

At each successive technology node, the minimum feature sizes are shrunk to roughly double the component density; hence reduce the cost per function. Innovations in lithography, such as multiple patterning, immersion deep ultraviolet (i-DUV), and $\lambda$=13.5 nm extreme ultraviolet (EUV) optics have brought some critical dimensions down close to ten nanometers. Nanoscale patterning for advanced IC designs is a challenge not only to optical systems but also to etching and associated masking techniques that are key elements of patterning technology. Processes such as anisotropic reactive ion etching (RIE) and atomic layer etch (ALE) are challenged to provide advanced IC fabrication technology for designs requiring high aspect ratio nanoscale features with almost atomic scale control of edge placement, sidewall profile, and etch selectivity to achieve high manufacturing yield. Further innovation in plasma etch technology is needed to meet the challenges of advanced IC manufacturing.

SUMMARY

A method for processing a substrate, the method includes providing a substrate having a dielectric layer disposed over a semiconductor substrate layer; forming a patterned hard mask layer over the dielectric layer, the patterned hard mask layer exposing a portion of a major surface of the dielectric layer; and removing a portion of the dielectric layer by performing a cyclic etch process including a plurality of cycles, where performing one cycle of the plurality of cycles includes forming a capping layer selectively over the patterned hard mask layer, and after forming the capping layer, performing a timed etch process, the timed etch process removing material from the dielectric layer.

A method for processing a substrate, the method includes providing a substrate having a dielectric layer disposed over a semiconductor substrate layer; forming a patterned hard mask layer over the dielectric layer, the patterned hard mask layer including a top portion and a bottom portion, and where the patterned hard mask layer exposes a portion of a major surface of the dielectric layer; performing a first timed etch process for a first etch time, the first timed etch process simultaneously removing a first portion of the dielectric layer and the top portion of the patterned hard mask layer; and removing a second portion of the dielectric layer by performing a cyclic etch process including a plurality of cycles, where performing one cycle of the plurality of cycles includes forming a reconstructed portion of the patterned hard mask layer by performing an area selective deposition process, and after forming the reconstructed portion of the hard mask layer, performing a second timed etch process for a second etch time, the second timed etch process removing material from the dielectric layer.

A method for patterning a substrate, the method includes providing a substrate having a dielectric layer disposed over a semiconductor substrate layer; forming a patterned hard mask layer over the dielectric layer, the patterned hard mask layer exposing a portion of a major surface of the dielectric layer; and performing a concurrent deposition and etch process to remove a portion of the dielectric layer, the concurrent deposition and etch process including removing material from the dielectric layer, and selectively coating the patterned hard mask layer with hard mask material.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

This disclosure describes embodiments of semiconductor processing methods for patterning a dielectric layer of a semiconductor substrate by an etch process that is a combination of area selective deposition (ASD) and etching techniques. The patterning methods utilize the ASD technique to deposit material selectively over a patterned etch hard mask layer. It is noted that the hard mask layer may comprise a single material or may be a stack of several layer comprising several materials. The selectively deposited material reinforces the capability of the hard mask layer to protect the dielectric material covered by the hard mask from being etched when the substrate is exposed to etchants that remove exposed portions of the dielectric layer. Furthermore, the innovative approach of reinforcing or reforming the hard mask layer after patterning the hard mask allows for greater flexibility in optimizing the hard mask to suppress undesirable effects of hard mask loss caused by etch. Accordingly, the embodiments described in this disclosure provide the advantages of a more precise control of the sidewall profile of the patterned features and improved pattern transfer fidelity.

First, a process flow 100 for patterning a dielectric layer is described by a flow diagram (illustrated in FIG. 1) and cross-sectional views of a semiconductor device at various stages of the process flow 100 (illustrated in FIGS. 2A-2F). The process flow 100 uses an ASD process step in a cyclic etch process that alternates between deposition and etch. In various embodiments, the deposition and etch processes may be performed in the same chamber or in different chambers. The ASD process periodically enhances the hard mask by selectively forming a capping layer over the patterned hard mask layer.

FIG. 3 and FIGS. 4A-4F illustrate a process flow 300 where a first timed etch is performed to remove a portion of the dielectric layer. A top portion of the patterned hard mask layer is also lost during the first timed etch. For example, the top portion of a stacked hard mask layer may be a topmost layer of the stack. The hard mask (e.g., a metal hard mask) reduced by etching, gets reconstructed periodically during an ASD process step in each cycle of a cyclic etch process. The ASD process steps in process flows 100 and 300 are explained further with reference to FIGS. 5A-5D.

In another embodiment, the dielectric layer is patterned using a process flow 600, described with reference to a flow chart in FIG. 6 and cross-sectional views of a semiconductor device at various stages of the process flow 600 in FIGS. 7A-7C. In process flow 600, a concurrent deposition and etch process is used to pattern the dielectric layer. The concurrent deposition and etch process comprises selectively coating the patterned hard mask layer using an ASD technique while, simultaneously, removing material from the dielectric layer.

Figure 1:
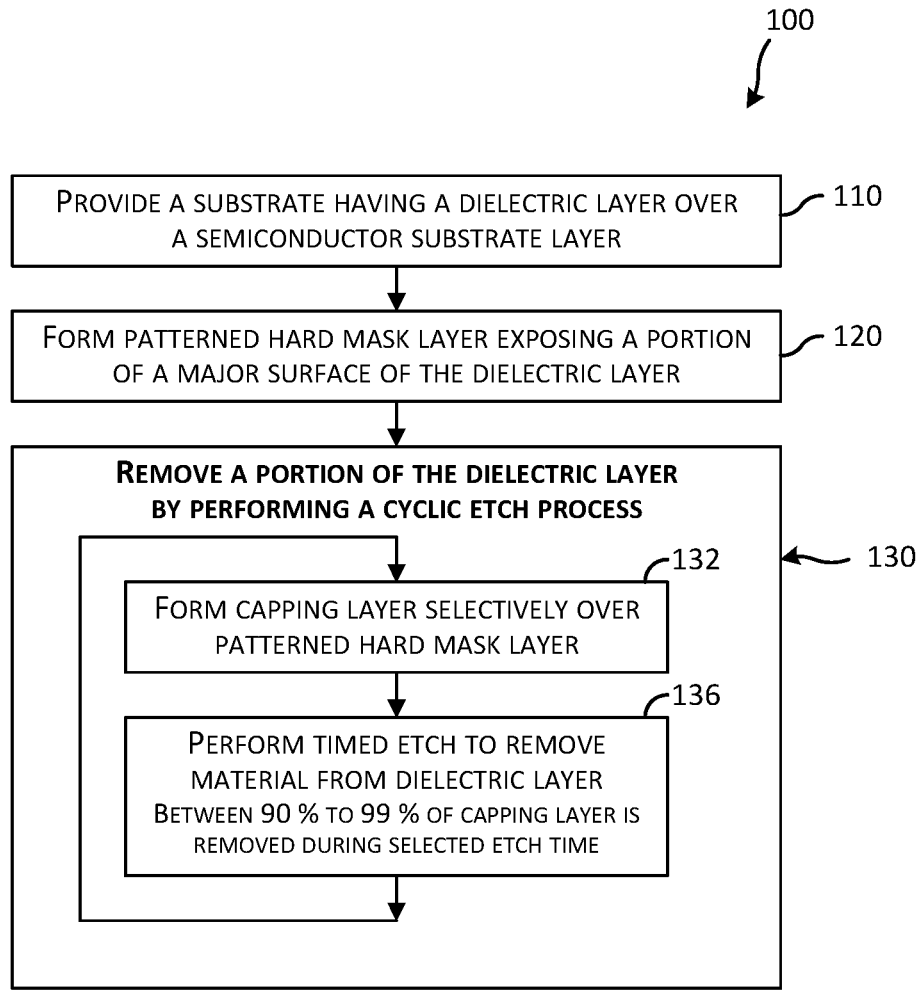
FIG. 1 illustrates a flow diagram for a method for patterning a dielectric layer using a cyclic etch process with selective deposition of a capping layer, in accordance with an embodiment.
Figure 2A:
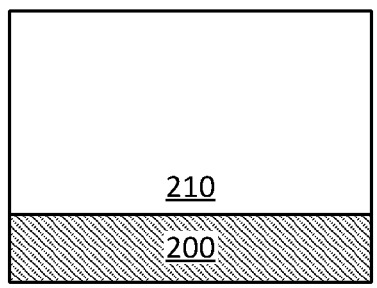
FIGS. 2A-2F illustrate cross-sectional views of a semiconductor device at various intermediate process steps in a process flow implementing the method illustrated in FIG. 1.

As illustrated by the flow diagram of the process flow 100, illustrated in FIG. 1, a semiconductor substrate (also shown in the cross-sectional view in FIG. 2A) having a dielectric layer 210 is provided, as indicated in block 110 of the process flow 100. In various embodiments, the dielectric layer 210 may comprise a single dielectric or a stack of several dielectric layers comprising several dielectrics, for example, silicon dioxide on low-k silicon oxide or silicon nitride on low-k silicon oxide and, in addition may include various etch stop layers (ESL) comprising, for example, silicon nitride, silicon-rich silicon oxide, silicon oxynitride, silicon carbide, silicon carbonitride, and the like. A low-k silicon oxide may comprise fluorosilicate glass (FSG), a carbon doped silicon oxide (CDO), orthosilicate glass (OSG), porous silicon oxide (SiCOH skeleton low-k), organic polymers, and the like. As illustrated in FIG. 2A, the dielectric layer 210 is formed over a substrate layer 200.

This stage of processing may be conducted after some or all process steps of the front end of the line (FEOL) processing have been completed. Alternatively, the discussed processes may be part of middle of the line (MOL) or back end of the line (BEOL) processing in a typical semiconductor IC fabrication process flow.

The layers below the dielectric layer 210 are collectively included in the substrate layer 200. The substrate layer 200 may include a semiconductor substrate including substrates with epitaxially grown semiconductor layers that include alloy semiconductors such as silicon germanium. The substrate layer 200 may comprise a bulk silicon substrate, silicon-on-insulator substrate, or hetero-structures such as gallium nitride on silicon and silicon on sapphire. The substrate layer 200 may also include other semiconductor substrates such as gallium arsenide, silicon carbide, germanium, and others.

Figure 2D:
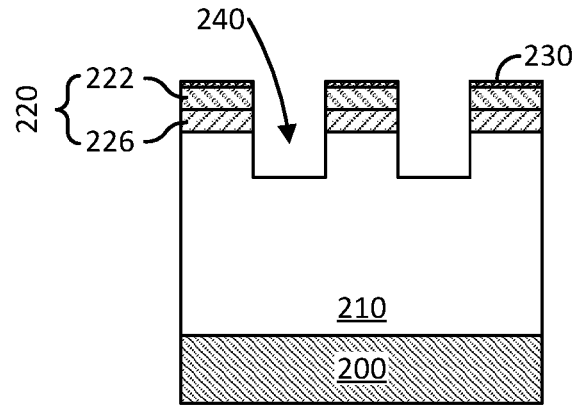
Figure 2B:
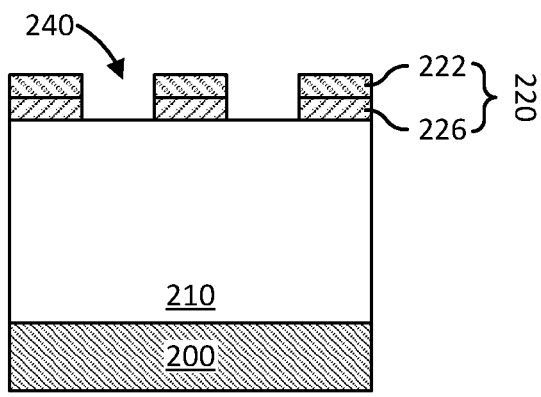

In block 120 of the flow diagram, and the respective cross-sectional view illustrated in FIG. 2B, a patterned hard mask layer 220 is formed over the dielectric layer 210, the patterning exposing portions of a top major surface of the dielectric layer 210. The hard mask layer 220 may be formed using suitable deposition (e.g., plasma enhanced atomic layer deposition (PEALD) and plasma enhanced chemical vapor deposition (PECVD)) techniques, and patterned using suitable photolithography (e.g., i-DUV and 13.5 nm EUV) and etch (e.g., anisotropic RIE) techniques. In some embodiments, there may be other layers formed over the hard mask layers. The patterning of the hard mask layer 220 may be performed subsequent to etching the layers above the hard mask layer 220.

In the example process flow 100, the dielectric layer 210 comprises, for example, doped silicon oxide, doped with carbon or hydrogen, or both carbon and hydrogen, to reduce its dielectric constant. The dielectric layer 210 may be formed by polymerization of silanes. As illustrated in FIG. 2B, the patterned hard mask layer 220, is disposed over the dielectric layer 210. The hard mask layer 220, in this example embodiment, is a stacked hard mask comprising, for example, two layers using two different materials: a first hard mask layer 226 and a second hard mask layer 222 disposed over the first hard mask layer 226. In other embodiments, the number of materials in a stacked hard mask layer may be different from two. The first hard mask layer 226 may comprise a metal-based layer such as titanium nitride, titanium, tantalum nitride, tantalum, tungsten based compounds, ruthenium based compounds, or aluminum based compounds, and the second hard mask layer 222 may comprise a dielectric layer such as silicon dioxide, silicon nitride, silicon oxynitride, carbon doped silicon oxide, silicon carbide, amorphous silicon, or polycrystalline silicon. If the hard mask layer 220 is covered by other layers prior to patterning then, in some embodiments, the second hard mask layer 222 may also be used as an etch stop layer in the composite patterning process.

Although, in the example process flow 100, the patterned hard mask layer 220 comprises a dielectric hard mask layer over a metallic hard mask layer, it is understood that, in some other embodiment, the patterned hard mask layer 220 may comprise a different number of hard mask layers and a different sequence of materials. For example, a single layer may be used as the patterned hard mask layer 220. Generally, the single layer of the hard mask layer 220 would be a metal-based layer similar to the first hard mask layer 226.

One application for dielectric layers, such as the dielectric layer 210, may be as interlayer dielectric (ILD) layers for a typical damascene BEOL interconnect structure. For this application, the dielectric layer 210 may be patterned to form trenches that are later filled with metal (e.g., copper) and damascened into the ILD layer to fabricate metal lines that may conduct electrical signals in an operating IC. The width of the openings 240 in FIG. 2B would be the metal linewidth, and the linewidth in the patterned hard mask layer 220 would be the dielectric spacing separating adjacent signal lines. As the minimum pitch is scaled aggressively, the operating electric field in the narrow space between adjacent signal lines trends upward. Because of the higher operating electric field, selecting a low dielectric constant (low-k) ILD material (e.g., porous silicon oxide) may be avoided, despite the penalty in increased parasitic capacitance between adjacent signal lines. As known to a person skilled in the art, the advantage of lower parasitic capacitance gained by using a low-k material is generally traded off with the disadvantages of reduced electrical reliability, low thermal conductivity, and poorer mechanical stability that comes with using a dielectric having k much less than 4, the value of k for pure silicon dioxide. Low-k dielectrics have shorter time dependent dielectric breakdown (TDDB) lifetime, higher thermal resistance, and lower mechanical strength. These tradeoffs raise concerns about the ability to provide electrically reliable and mechanically stable structures at the high electric fields and aspect ratios expected in a minimum pitch pattern for an advanced IC design. Accordingly, the dielectric layer 210 may comprise silicon oxide having a dielectric constant, k, in an intermediate range, for example, between about 2.7 and 3.5 to achieve adequate reliability margin and low etch defects induced by mechanically unstable high aspect ratio structures by trading off the performance benefit provided by ultra-low k ILD.

Generally, an etch process for removing low-k dielectric material is less aggressive than a respective process for intermediate-k silicon oxide having, for example, k between about 2.7 and 3.5. The more aggressive etch process may also increase the rate of hard mask material removed during etching the dielectric layer 210. It is known to a person skilled in the art that loss of hard mask material is a constraint in designing an etch process, especially for etching a layer to form high aspect ratio openings with precise control of lateral dimensions and sidewall profile. Compensating for the loss of hard mask material by increasing its thickness may be limited by the penalty of increasing the aspect ratio because high aspect ratio features may be more difficult to form with precise control of critical dimensions and sidewall profiles. Moreover, the hard mask layer thickness may be constrained by optical reflections and interference patterns that may distort the photoresist pattern (e.g., cause wavy photoresist edge profiles) used to mask the hard mask etch.

In the process flow 100, the impact of hard mask material loss is mitigated by performing a cyclic etch process (block 130) where, in each cycle, a capping layer is deposited selectively over the hard mask layer 220 (box 132) using an ASD technique prior to removing a portion of the dielectric layer 210 by a sub-cycle etch step (box 136) using, for example, an anisotropic RIE. The sub-cyclic etch may be a timed etch step or may comprise a plurality of etch steps that are self-limiting. The cyclic etch process alternates between an ASD step and an etch step till a target thickness of the exposed dielectric layer 210 is removed.

The first cycle of the cyclic etch process is described with reference to the cross-sectional views of the semiconductor device illustrated in FIGS. 2C and 2D. In FIG. 2C, the capping layer 230 is selectively formed over the second hard mask layer 222 using an ASD process. Selectively depositing the capping layer 230 over the patterned hard mask layer 220 reinforces the capability to protect the portion of the dielectric layer 210 covered by the patterned hard mask layer 220. After completing the ASD process, a sub-cycle etch process, e.g., a timed etch process, is performed to remove a portion of the exposed dielectric layer 210, as seen from an increase in the depth of the openings 240 illustrated in FIG. 2D. The thinned capping layer 230 in FIG. 2D illustrates that the etch time per cycle may be selected such that the etching process is stopped when almost the entire capping layer has been removed. In various embodiments, the etch time may be selected such that 90% to 99% of the deposited thickness of the capping layer 230 is removed by the time the etching is paused for the ASD process to be initiated in the next cycle of the cyclic etch process. It is understood that, because of process variations, the capping layer 230 may be completely removed in some instances.

Figure 2E:
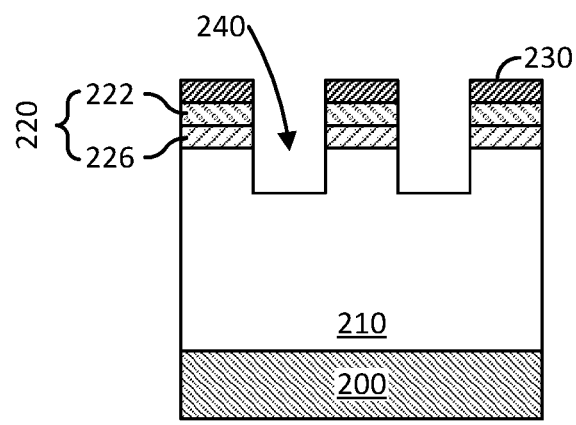
Figure 2C:
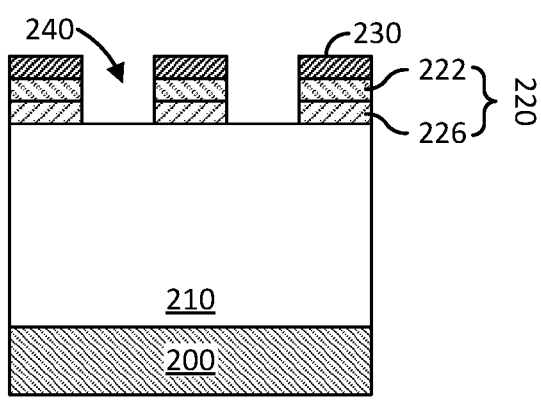

FIG. 2E illustrates a cross-sectional view of the semiconductor device after the ASD process of the next cycle is completed and the capping layer 230 has been restored or re-formed.

It is noted that the ASD step (box 132) of each cycle (block 130) of process flow 100 may be a plasma process during which some amount of the ILD may be removed from the dielectric layer 210 to deepen opening 240. The removal rate of the ILD during the ASD step (box 132) would be low relative to the removal rate during the timed etch step (box 136). It is also noted that the timed etch step (box 136) of each cycle (block 130) of process flow 100 may be a plasma etch (e.g., RIE) during which a small amount of the material of the capping layer 230 may form as a consequence of reaction with etch byproducts produced by chemical and physical effects of the etch process (a co-redeposition process). In process 100, the formation rate may be too low to result in forming a coating over the surface during the timed etch step (box 136).

Figure 2F:
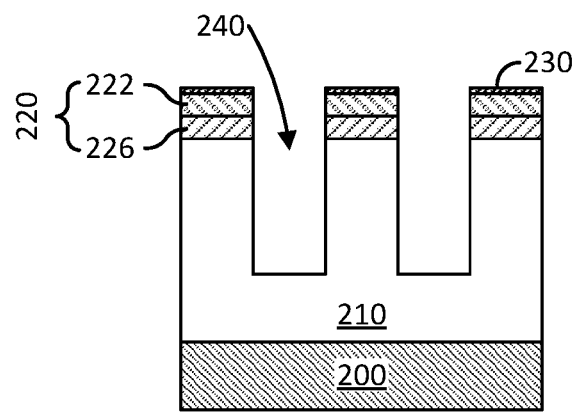

FIG. 2F illustrates a cross-sectional view of the semiconductor device after a target thickness of the exposed portion of the dielectric layer 210 has been removed by performing a plurality of cycles to complete the process flow 100. In the example process flow 100, a predetermined number of cycles, specified in the process recipe, may be performed to extend the openings 240 to a desired depth, as illustrated in FIG. 2F. However, it is understood that, in some other embodiment, the cumulative etch time may be determined by an endpoint signal generated when the openings 240 extend to a depth that exposes a surface of an etch stop layer embedded in the dielectric layer 210.

In the example process flow 100, forming the capping layer 230 selectively over the second hard mask layer 222 comprises depositing capping material over a dielectric surface comprising materials as listed above using a suitable ASD process. In some embodiments, the capping layer 230 may comprise a silicon-based material such as silicon-rich silicon oxide, silicon-rich silicon nitride, silicon-rich silicon carbide, amorphous silicon, and polycrystalline silicon. In some embodiments, the capping layer 230 may comprise a metal-based material such as a metal, metal-rich oxide, or metal-rich nitride. Examples of metal-based materials suitable for the capping layer 230 include titanium nitride, titanium, tantalum nitride, tantalum, tungsten based compounds, ruthenium based compounds, and aluminum based compounds. It is understood that other combinations of materials may be used. The ASD processes are described in further detail below with reference to FIGS. 5A-5D.

Figure 3:
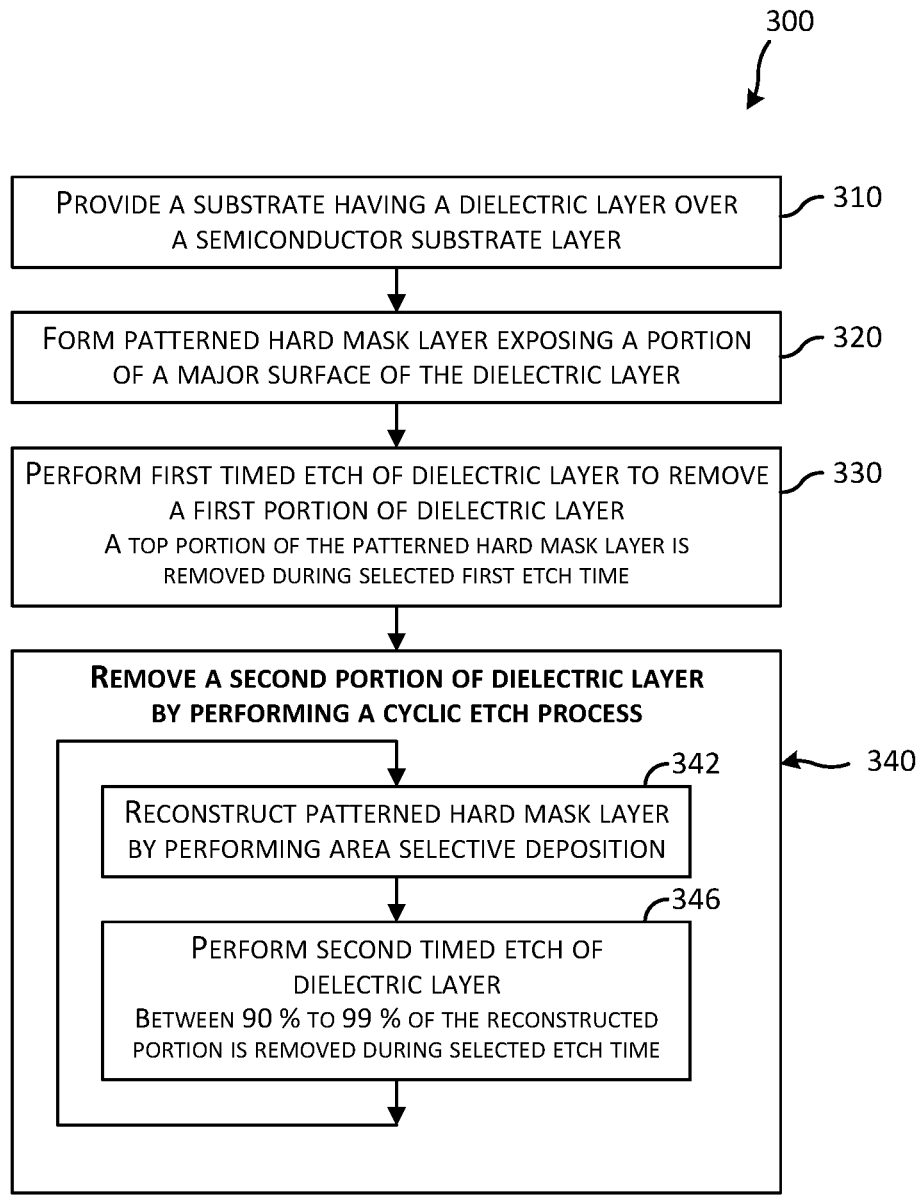
FIG. 3 illustrates a flow diagram for a method for patterning a dielectric layer using a cyclic etch process with selective reconstruction of a hard mask layer, in accordance with an embodiment.

FIG. 3 illustrates a flow diagram of the process flow 300 for patterning the dielectric layer 210. As indicated in block 310, the incoming substrate for the process flow 300 is similar to the incoming substrate for the process flow 100. The patterned hard mask layer 220 has openings 240 exposing a portion of the dielectric layer 210, as indicated in block 320 in FIG. 3. As illustrated in the cross-sectional view in FIG. 4A, the hard mask layer 220 used in the example embodiment for process flow 300 is a stacked hard mask layer, similar to the example embodiment described above for process flow 100. Again, it is understood that other embodiments may use other hard mask layers. The hard mask layer 220 may comprise materials similar to those described above for the process flow 100.

As illustrated in FIG. 3, in process flow 300, a first timed etch (block 330) is performed to remove a first portion of the dielectric layer 210. The first timed etch (block 330) is performed without forming any protective layer over the hard mask layer 220. In the absence of a protective cap, a top portion of the hard mask layer 220 gets removed by the first timed etch, as described with reference to the cross-sectional image illustrated in FIG. 4B.

Figure 4A:
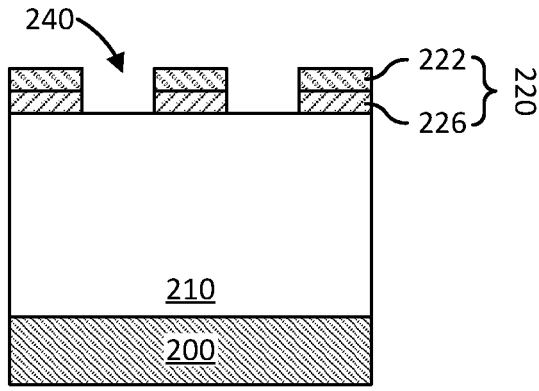
FIGS. 4A-4F illustrate cross-sectional views of a semiconductor device at various intermediate process steps in a process flow implementing the method illustrated in FIG. 3.
Figure 4B:
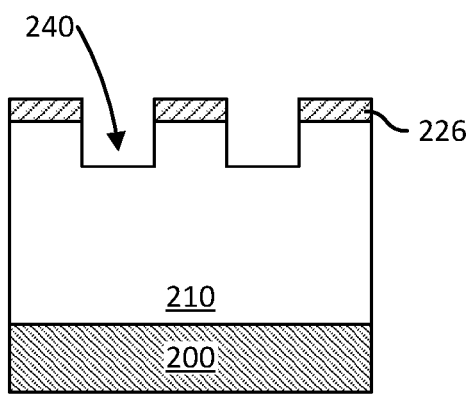

FIG. 4B illustrates a cross-sectional view of the semiconductor device of the example embodiment after the first timed etch is completed at the end of the first etch time. As illustrated in FIG. 4B, in this example, the second hard mask layer 222 has been removed and the first hard mask layer 226 remains covering a portion of the top surface of the dielectric layer 210. In various other embodiments, the top portion of the patterned hard mask layer, removed by the first timed etch, may comprise a top portion of a single layer hard mask or may comprise a different top portion of a stacked hard mask. The remaining patterned hard mask layer 226 is reinforced or re-formed by periodically reconstructing the hard mask by selectively depositing new hard mask material using an ASD process step in each cycle of a cyclic etch process (block 340), as indicated by box 342 in block 340 in the flow diagram illustrated in FIG. 3.

Figure 4C:
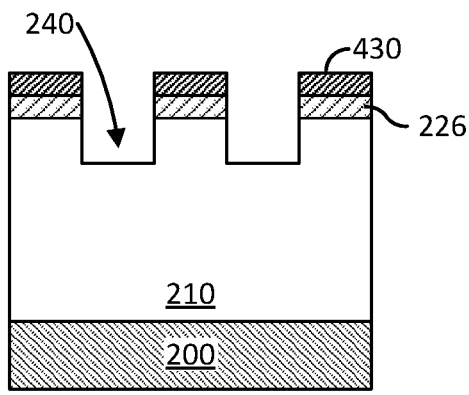
Figure 4D:
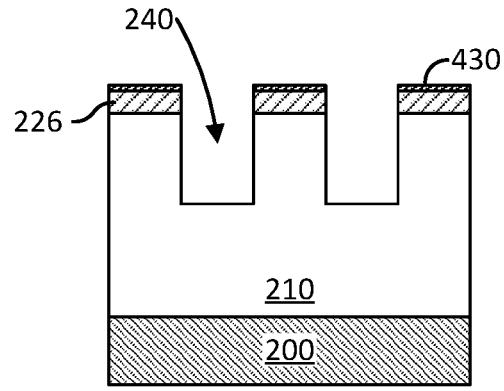

The hard mask reconstruction step in the first cycle of the cyclic etch process is illustrated in FIG. 4C. In FIG. 4C, the reconstructed portion of the hard mask layer 430 is selectively formed over the first hard mask layer 226 using an ASD process. FIG. 4D illustrates the etch step of the two-step cyclic etch process of process 300, as described in the flow diagram in FIG. 3 by box 346 of block 340. In FIG. 4D, a second timed etch process is performed for a selected second etch time. The second timed etch further removes material from the dielectric layer 210, as seen from an increase in the depth of the openings 240. As illustrated in FIG. 4D, the etch time per cycle (the second etch time) may be selected such that the etching process is stopped when almost the entire reconstructed portion of the hard mask layer 430 has been removed. In various embodiments, the second etch time may be selected such that 90% to 99% of the deposited thickness of the reconstructed portion of the hard mask layer 430 is removed by the time the etching is paused for the ASD process to be initiated in the next cycle of the cyclic etch process. It is understood that, because of process variations, the reconstructed portion of the hard mask layer 430 may be completely removed in some instances.

Figure 4E:
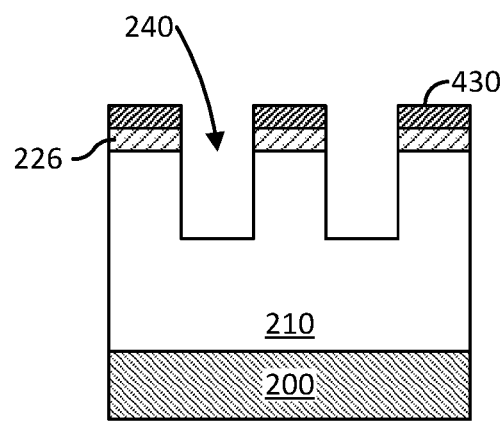

FIG. 4E illustrates a cross-sectional view of the semiconductor device after the ASD process of the next cycle has completed depositing material to again form the reconstructed portion of the hard mask layer 430 over the first hard mask layer 226. In some embodiments, the reconstructed portion of the hard mask layer 430 may comprise a silicon-based material. In some embodiments, the reconstructed portion of the hard mask layer 430 may comprise a metal-based material. The reconstructed portion of the hard mask layer 430 may comprise materials similar to those described above for the capping layer 230 in process flow 100. The materials may be deposited by a suitable ASD process to form the reconstructed portion of the hard mask layer 430 selectively over the first hard mask layer 226. The ASD processes are described in further detail below with reference to FIGS. 5A-5D.

Similar to process flow 100, in process flow 300, there may be some ILD material removed at a low removal rate while depositing material to form the reconstructed portion of the hard mask layer 430, and there may be some materials formed from reactions with etch byproducts.

Figure 4F:
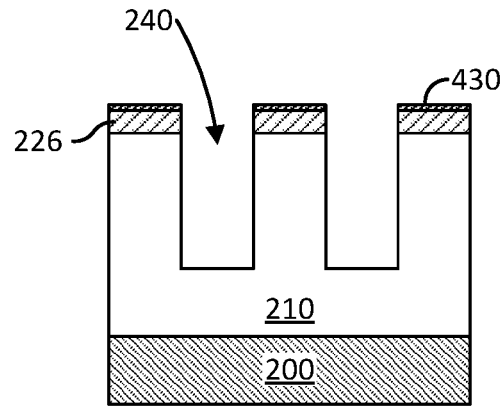

FIG. 4F illustrates a cross-sectional view of the semiconductor device after a second portion of the dielectric layer 210 has been removed by performing a predetermined number of cycles, specified in the process flow 300. The total amount of material removed from the dielectric layer 210 is the sum of the first and second portions of the dielectric layer 210. Thus, completing the cyclic etch process (block 340) of the process flow 300 may extend the openings 240 to a desired depth, as illustrated in FIG. 4F. It is understood that, in some other embodiment, the cumulative etch time may be determined by an endpoint signal generated when the openings 240 extend to a depth that exposes a surface of an etch stop layer embedded in the dielectric layer 210.

FIGS. 5A-5D illustrate the ASD processes used in the cyclic etch process used in the process flows 100 and 300 to selectively form the capping layer 230 (in process flow 100) and reconstructed portion of the hard mask layer 430 (in process flow 300).

In the embodiments described above, the surface over which the deposition is intended to be blocked comprises silicon oxide (the exposed material of the dielectric layer 210). The surface over which the protective layers are preferentially formed may be either dielectric material or a metal-based layer, in various embodiments. For example, in the example embodiment of the process flow 100 described above, the capping layer 230 is formed over the second hard mask layer 222, which is a dielectric layer. On the other hand, in the example embodiment of the process flow 300, the reconstructed portion of the hard mask layer 430 is formed over the first hard mask layer 222, which is a metal-based layer.

The materials that are deposited selectively to form the capping layer 230 (in process flow 100) and the reconstructed portion of the hard mask layer 430 (in process flow 300) may be in two broad categories, as described above. In some embodiments, the selectively deposited material may comprise a silicon-based material and, in some other embodiments, the selectively deposited material may comprise a metal-based material. The ASD processes may be adjusted according to the materials specific to the embodiment.

The ASD processes for embodiments where silicon-based material is selectively deposited are described with reference to FIGS. 5A and 5B. The ASD processes for embodiments where metal-based material is selectively deposited are described with reference to FIGS. 5C and 5D.

Figure 5A:
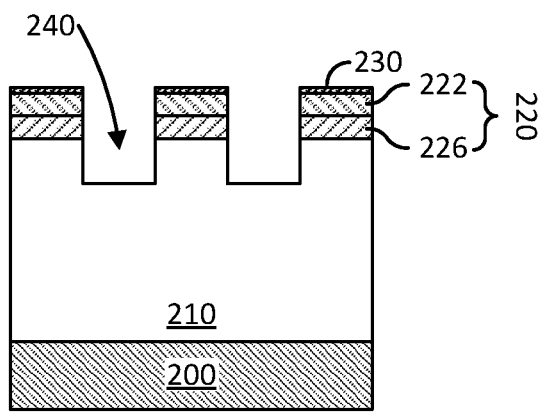
FIGS. 5A-5B show the cross-sectional views illustrated in FIGS. 2D and 2E to further illustrate the selective deposition process for the selective deposition of a capping layer.
Figure 5B:
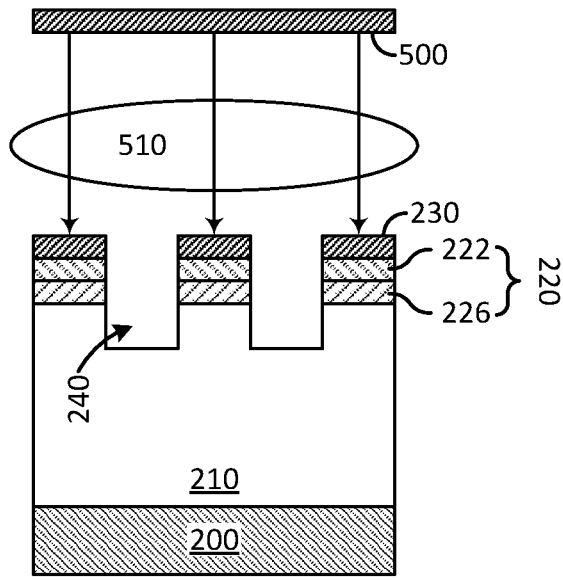

In the example illustrated in FIGS. 5A and 5B, the ASD step in process flow 100 (see box 132 in FIG. 1) may deposit silicon-based material to form the capping layer 230 over the hard mask layer 220. The cross-sectional view of the semiconductor device prior to performing the ASD process of process flow 100, as illustrated in FIG. 2D is repeated in FIG. 5A for convenience. In the embodiment of process flow 100, the capping layer 230 is formed over the second hard mask layer 222. The various materials that may be used for the second hard mask layer 222 are described above with reference to FIG. 2B.

FIG. 5B illustrates the ASD process in process flow 100 being performed to selectively form the capping layer 230 over the second hard mask layer 222.

The area-selectivity of the ASD process may be achieved by first conditioning the surface by a suitable plasma pretreatment step. The plasma pretreatment may cause the deposition to occur preferentially over the second hard mask layer 222 by using, for example, plasma etching that renders the surface over the second hard mask layer 222 to be more hydrophilic relative to the surface over the dielectric layer 210. The various silicon-based materials that may be used for the capping layer 230 have been described above with reference to FIG. 2B. The ASD process may be a plasma-enhanced process using direct plasma 510 over the surface of the semiconductor substrate in the processing chamber, as illustrated in FIG. 5B. The plasma 510 may be formed using a gaseous mixture comprising, for example, a hydrofluorocarbon and other gases contributing, for example, argon, nitrogen, hydrogen, and oxygen species to the plasma. The deposition may be assisted by sputtering silicon. As illustrated in FIG. 5B, ions (e.g., argon ions) may be accelerated by electric fields to hit sputter target 500 comprising silicon or a silicon-rich compound. Ejected silicon atoms may then interact with other reactants such as oxygen to form the silicon-rich material used in forming the capping layer 230.

The ASD processes for embodiments where metal-based material is selectively deposited are described with reference to FIGS. 5C and 5D.

Figure 5C:
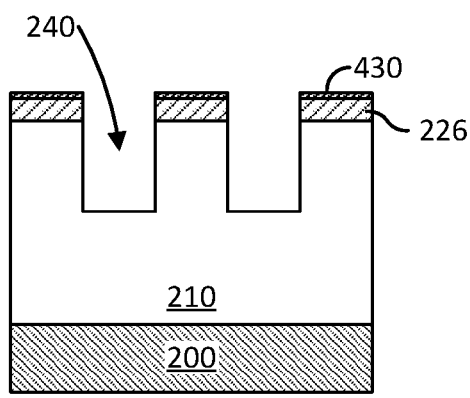
FIGS. 5C-5D show the cross-sectional views illustrated in FIGS. 4D and 4E to further illustrate the selective deposition process for the selective reconstruction of a hard mask layer.
Figure 5D:
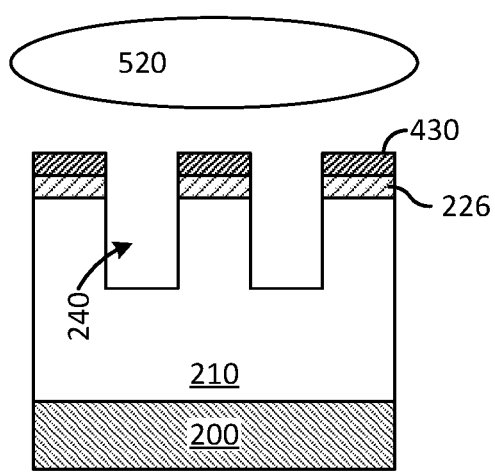

In the example illustrated in FIGS. 5C and 5D, the ASD step in process flow 300 (see box 342 in FIG. 3) may deposit metal-based material to form the reconstructed portion of the hard mask layer 430 over the first hard mask layer 226. The cross-sectional view of the semiconductor device prior to performing the ASD process of process flow 300, as illustrated in FIG. 4D is repeated in FIG. 5C for convenience. As described above, in process flow 300, the first timed etch is performed (block 330) prior to performing the cyclic etch process (block 340). Thus, in the process flow 300, the second hard mask layer 222 may be removed by the first timed etch and the top surface of the remaining hard mask may be the metal-based top surface of the first hard mask layer 226, as illustrated in FIG. 5C.

As explained in the context of the ASD step described above with reference to FIG. 5B, the area-selectivity of the ASD process illustrated in FIG. 5D may also be achieved with the assistance of a plasma pretreatment step. The plasma pretreatment may be, for example, suitable plasma etch that conditions the surface over the first hard mask layer 226 to be more preferable to metal deposition relative to the surface over the dielectric layer 210. The various metal-based materials that may be used for the reconstructed portion of the hard mask layer 430 have been described above with reference to FIG. 4E.

As illustrated in FIG. 5D, the semiconductor substrate may be exposed to direct plasma 520 formed using a gaseous mixture comprising a hydrofluorocarbon and a volatile metal based gas containing the metal species used for forming the metal-based material of the reconstructed portion of the hard mask layer 430. For example, the metal based gas may comprise titanium fluoride to provide titanium atoms to form metallic titanium or titanium-rich compound for forming the reconstructed portion of the titanium based hard mask layer 430. However, it is not only limited to Titanium based hard mask. It can be tungsten based gas and tungsten based hard mask and so on. Other gases used for plasma 520 may provide other species present in the plasma such as argon, nitrogen, hydrogen, and oxygen. As mentioned above, there may be some etching of the dielectric layer 210 during the ASD process. In some embodiments, the etch byproducts interact to form deposits that get used in forming the reconstructed portion of the hard mask layer 430. Generally, the ASD processes used to selectively deposit metal-based material are not sputtering assisted processes such as the sputter-assisted process described above for depositing silicon-rich materials.

It is understood that a person skilled in the art may modify these illustrative examples of ASD processes for the other combinations of materials.

Figure 6:
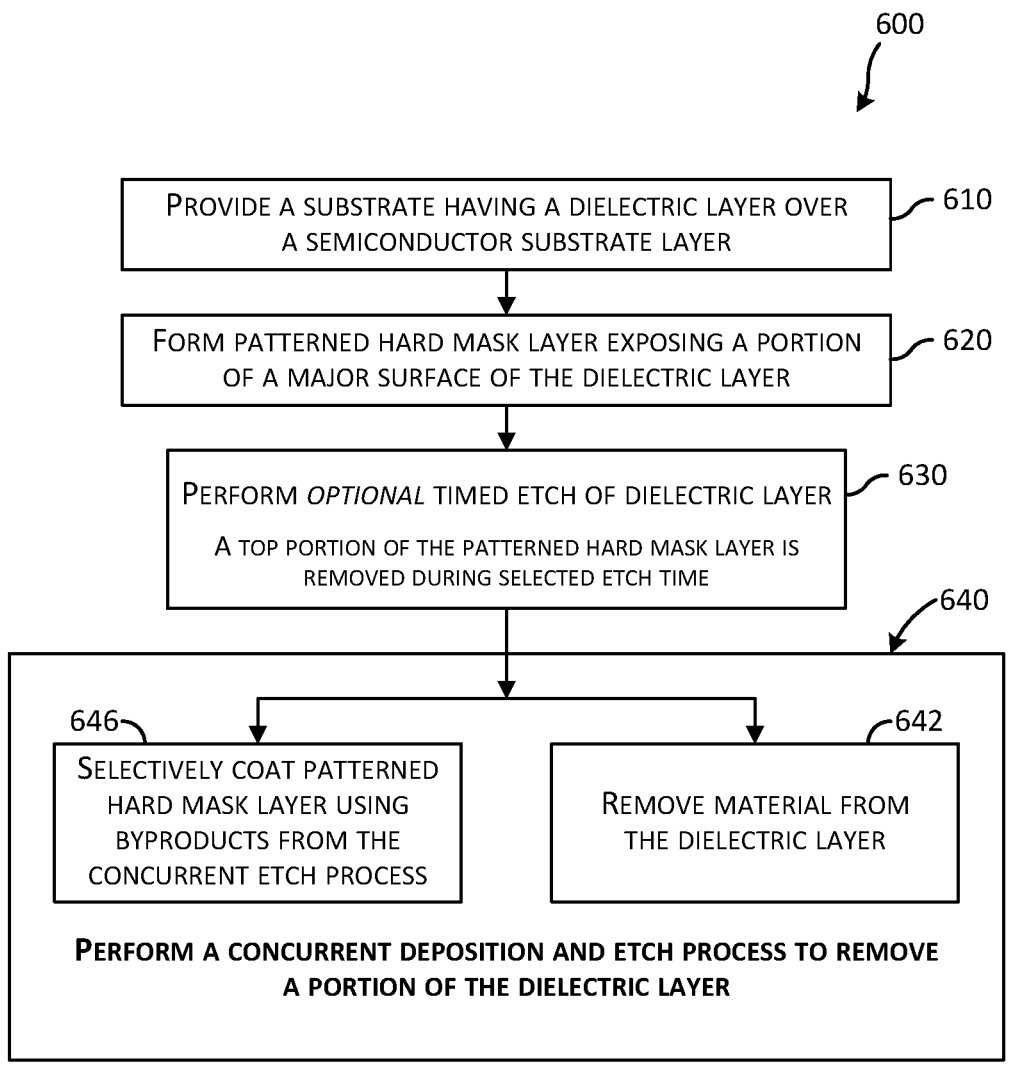
FIG. 6 illustrates a flow diagram for a method for patterning a dielectric layer using a concurrent deposition and etch process with selective coating of a hard mask layer, in accordance with an embodiment.
Figure 7A:
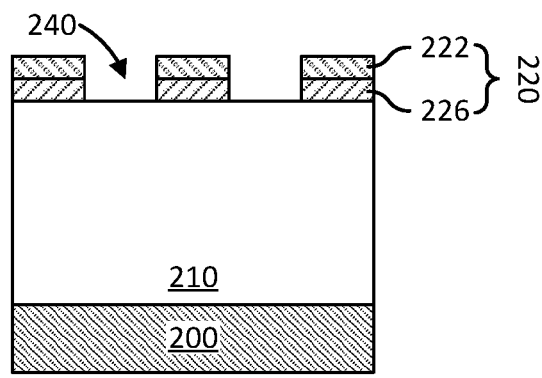
FIGS. 7A-7C illustrate cross-sectional views of a semiconductor device at various intermediate process steps in a process flow implementing the method illustrated in FIG. 6.
Figure 7B:
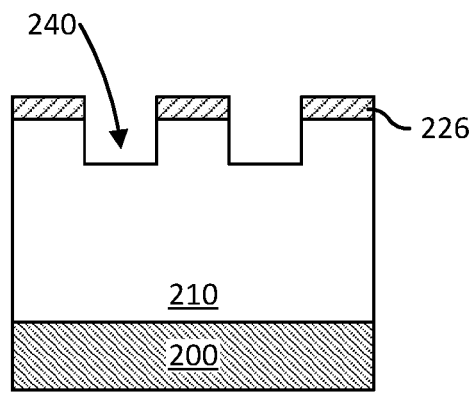

FIG. 6 illustrates a flow diagram for the process flow 600. In process flow 600, a concurrent deposition and etch process (indicated in block 640) is used to pattern the dielectric layer.

As indicated in block 610, the incoming substrate for the process flow 600 is similar to the incoming substrate for the process flows 100 and 300. Also, as indicated in block 620 in FIG. 6 and illustrated in FIG. 7A, the patterned hard mask layer 220 is formed having openings 240 exposing a portion of the dielectric layer 210, similar to the process flows 100 and 300. The hard mask layer 220 used in the example embodiment for process flow 600 is also a stacked hard mask layer, similar to the example embodiments described above for process flows 100 and 300. Again, it is understood that other embodiments may use other hard mask layers.

The substrate with the patterned hard mask layer 220 may then be etched using the concurrent deposition and etch process indicated in block 640. Optionally, a timed etch process (block 630) may be performed to remove a portion of the exposed dielectric layer 210 prior to performing the concurrent deposition and etch process (block 640). The optional timed etch process (block 630) may be similar to the first timed etch process performed in process flow 300 (see block 330 in FIG. 3). For illustration purposes, the optional timed etch has been included in the example flow 600. Accordingly, as described above with reference to block 330 in FIG. 3 and the cross-sectional view in FIG. 4B (repeated as FIG. 7B for convenience), a top portion of the patterned hard mask layer may be removed. As illustrated in FIG. 7B, in this example, the second hard mask layer 222 has been removed and the first hard mask layer 226 remains covering a portion of the top surface of the dielectric layer 210. Similar to the process flow 300, the first hard mask layer 226 in process flow 600 may also be a metallic layer. The various materials that may be used for the first hard mask layer 226 are described above with reference to FIG. 2B.

As illustrated in the flow diagram for process flow 600 in FIG. 6, the concurrent deposition and etch process comprises an etch process, for example, a timed RIE process, indicated by box 642 in block 640, and an ASD process, indicated by box 646 in block 640, performed simultaneously. The concurrent etch (box 642) and ASD process (box 646) is illustrated by the cross-sectional view in FIG. 7C. As illustrated in FIG. 7C, material selectively deposited by the ASD process over the first hard mask layer 226 may be forming a coating 730, thereby continuously reinforcing the first hard mask layer 226. The increased depth of the openings 240 indicates the concurrent etching of the dielectric layer 210.

The coating 730 may comprise silicon-based materials and/or metal-based materials. ASD techniques, similar to those described above for process flows 100 and 300 with reference to FIGS. 5A-5D, may also be used for the selective deposition process (box 646 in FIG. 6) of process flow 600. For example, the plasma pretreatment of the surface (described above) may be used to enhance the area selectivity of the ASD process to form the coating 730. Sputter-assisted deposition of silicon-based material may be used, in which accelerated argon ions eject silicon from a sputter target. Plasma 530 (illustrated in FIG. 7C) comprising a metal-based gas may be used for forming a coating 730 with a metal-based material. It is noted that if a metal-based coating 730 is formed then, generally, the ASD process is not assisted by sputtering.

Figure 7C:
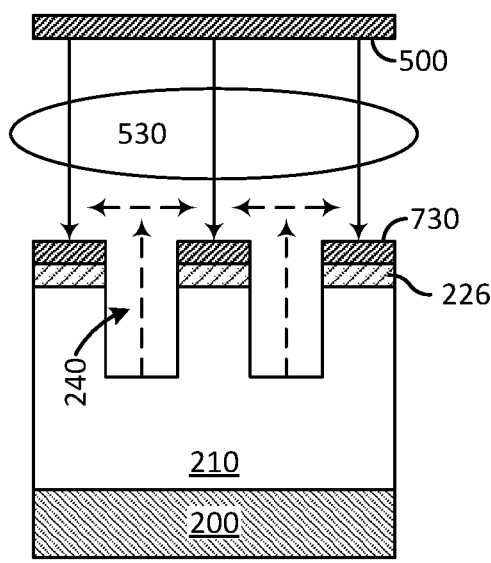

In addition to the techniques described above, the selective deposition process for the process flow 600 makes greater use of the technique of forming some of the material used to selectively coat the first hard mask layer 226 from the byproducts of the etch process (box 642), as indicated by the dashed arrows in FIG. 7C. The etch process may be RIE using direct plasma 530, as illustrated in FIG. 7C. Plasma 530 may comprise hydrofluorocarbon, along with other gases may be used to perform etching of the dielectric layer 210 using a fluorine-based etch chemistry. The volatile etch byproducts may be reacted with reactant species in plasma 530, thereby depositing the coating material preferentially over the first hard mask layer 226 to form coating 730. The area selectivity may be achieved by plasma treatment of the surface performed in the initial stage of the concurrent deposition and etch process (box 640 in FIG. 6).

The concurrent deposition and etch process may be a timed process, where a processing time is selected to remove a portion of the dielectric layer 210. It is understood that, in some other embodiment, the cumulative etch time may be determined by an endpoint signal generated when the openings 240 extend to a depth that exposes a surface of an etch stop layer embedded in the dielectric layer 210.

As known to persons skilled in the art, designing a hard mask layer for etching nanoscale features with high aspect ratios has to consider multiple factors. Sufficient margin for etch selectivity has to be provided, both while patterning the hard mask layer and while removing the target material with the hard mask as the masking layer. Insufficient selectivity may degrade pattern quality with undesirable undercutting, surface damage, and etch nonuniformity. In addition, enhanced erosion at the edges and corners of the patterned hard mask layer during the dielectric layer etch may lead to poor control of the sidewall profiles of features patterned in the target dielectric layer. Although the masking ability of the hard mask layer may be enhanced by increasing the hard mask layer thickness, the accompanied increase in the aspect ratio has adverse effects on patterning. The methods described in this disclosure reinforce the patterned hard mask layer, thereby allowing for better optimization of the etch process. Hence, using the embodiments of patterning methods described herein may improve sidewall profile control, pattern fidelity, patterning defects.

Example 1. A method for processing a substrate, the method includes providing a substrate having a dielectric layer disposed over a semiconductor substrate layer; forming a patterned hard mask layer over the dielectric layer, the patterned hard mask layer exposing a portion of a major surface of the dielectric layer; and removing a portion of the dielectric layer by performing a cyclic etch process including a plurality of cycles, where performing one cycle of the plurality of cycles includes forming a capping layer selectively over the patterned hard mask layer, and after forming the capping layer, performing a sub-cycle etch process, the sub-cycle etch process removing material from the dielectric layer.

Example 2. The method of example 1, where the dielectric layer includes silicon oxide having a dielectric constant greater than or equal to 2.7 and less than or equal to 4.0.

Example 3. The method of one of examples 1 or 2, where a top surface of the patterned hard mask layer includes a metallic surface or a dielectric surface.

Example 4. The method of one of examples 1 to 3, where the capping layer includes a material different from the material of the top surface of the patterned hard mask layer.

Example 5. The method of one of examples 1 to 4, where the patterned hard mask layer includes: a first hard mask layer disposed over the dielectric layer and a second hard mask layer disposed over the first hard mask layer, the second hard mask layer including a material different from the first hard mask layer.

Example 6. The method of one of examples 1 to 5, where the first hard mask layer includes a metallic layer, and the second hard mask layer includes a dielectric layer.

Example 7. The method of one of examples 1 to 6, where the first hard mask layer includes titanium nitride, titanium, tantalum nitride, tantalum, ruthenium, tungsten based compounds, or aluminum based compounds, and the second hard mask layer includes silicon dioxide, silicon nitride, silicon oxynitride, silicon carbide, carbon doped silicon, or carbon doped silicon oxide.

Example 8. The method of one of examples 1 to 7, where forming the capping layer includes forming a silicon-rich dielectric layer, silicon, silicon carbide, carbon doped silicon, doped silicon oxide, selectively over the patterned hard mask layer.

Example 9. The method of one of examples 1 to 8, where forming the silicon-rich dielectric layer selectively over the patterned hard mask layer includes exposing the substrate to a gaseous mixture including silicon tetrachloride or silicon tetrafluoride.

Example 10. The method of one of examples 1 to 9, where forming the capping layer includes forming a metallic layer selectively over the patterned hard mask layer.

Example 11. The method of one of examples 1 to 10, where forming the metallic layer selectively over the patterned hard mask layer includes selectively depositing titanium nitride, titanium, tantalum nitride, tantalum, ruthenium, tungsten based compounds, or aluminum based compounds.

Example 12. The method of one of examples 1 to 11, where forming the capping layer selectively over the patterned hard mask layer includes performing a sputter deposition process of Si-rich layer.

Example 13A. The method of one of examples 1 to 12, where the sub-cycle etch process is a timed etch process.

Example 13B. The method of one of examples 13A, further including: selecting a deposition thickness for the capping layer; and selecting an etch time for the timed etch process to etch 90% to 99% of the selected deposition thickness of the capping layer.

Example 14A. The method of one of examples 1 to 13B, where performing the cyclic etch process forms an opening in the dielectric layer, the opening having a substantially vertical sidewall.

Example 14B. The method of example 1 to 14A, further including: detecting an endpoint signal; and terminating the sub-cycle etch process and the cyclic etch process after detecting the endpoint signal.

Example 15. A method for processing a substrate, the method includes providing a substrate having a dielectric layer disposed over a semiconductor substrate layer; forming a patterned hard mask layer over the dielectric layer, the patterned hard mask layer including a top portion and a bottom portion, and where the patterned hard mask layer exposes a portion of a major surface of the dielectric layer; performing a first timed etch process for a first etch time, the first timed etch process simultaneously removing a first portion of the dielectric layer and the top portion of the patterned hard mask layer; and removing a second portion of the dielectric layer by performing a cyclic etch process including a plurality of cycles, where performing one cycle of the plurality of cycles includes forming a reconstructed portion of the patterned hard mask layer by performing an area selective deposition process, and after forming the reconstructed portion of the hard mask layer, performing a second timed etch process for a second etch time, the second timed etch process removing material from the dielectric layer.

Example 16. The method of example 15, further includes selecting a deposition thickness for the reconstructed portion of the hard mask layer; and selecting the second etch time for the second timed etch process to etch 90% to 100% of the selected deposition thickness of the reconstructed portion of the hard mask layer.

Example 17. The method of one of examples 15 or 16, where the bottom portion of the hard mask layer includes a metallic layer, and the top portion of the hard mask layer includes a dielectric layer.

Example 18. A method for patterning a substrate, the method includes providing a substrate having a dielectric layer disposed over a semiconductor substrate layer; forming a patterned hard mask layer over the dielectric layer, the patterned hard mask layer exposing a portion of a major surface of the dielectric layer; and performing a concurrent deposition and etch process to remove a portion of the dielectric layer, the concurrent deposition and etch process including removing material from the dielectric layer, and selectively coating the patterned hard mask layer with hard mask material.

Example 19. The method of example 18, where selectively coating the patterned hard mask layer includes selectively depositing material formed from the removing.

Example 20. The method of one of examples 18 or 19, where the selectively coating the patterned hard mask layer includes selectively depositing material with sputtering.

Example 21. The method of one of examples 18 to 20, where the selectively coating the patterned hard mask layer includes selectively depositing material by exposing the substrate to a precursor gas.

Example 22. The method of one of examples 18 to 21, further including: prior to performing the concurrent deposition and etch process, performing a timed etch process for a selected etch time, the timed etch process simultaneously removing a portion of the dielectric layer and a top portion of the patterned hard mask layer, where the patterned hard mask layer includes the top portion and a bottom portion underlying the top portion.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:
providing a substrate having a dielectric layer disposed over a semiconductor substrate layer;
forming a patterned hard mask layer over the dielectric layer, the patterned hard mask layer comprising a top portion and a bottom portion, wherein the patterned hard mask layer exposes a portion of a major surface of the dielectric layer, the bottom portion comprising a metal-containing hard mask material including titanium nitride, titanium, tantalum nitride, tantalum, ruthenium, tungsten based compounds, or aluminum-based compounds, and the top portion comprising a dielectric-containing hard mask material including silicon dioxide, silicon nitride, silicon oxynitride, silicon carbide, carbon doped silicon, or carbon doped silicon oxide;
performing a first timed etch process for a first etch time, the first timed etch process simultaneously removing a first portion of the dielectric layer and the top portion of the patterned hard mask layer; and
removing a second portion of the dielectric layer by performing a cyclic etch process comprising a plurality of cycles, wherein performing one cycle of the plurality of cycles comprises
forming a reconstructed portion of the patterned hard mask layer by performing an area selective deposition process, and
after forming the reconstructed portion of the hard mask layer, performing a second timed etch process for a second etch time, the second timed etch process removing material from the dielectric layer and the reconstructed portion.

2. The method of claim 1, further comprising:
selecting a deposition thickness for the reconstructed portion of the hard mask layer; and
selecting the second etch time for the second timed etch process to etch 90% to 100% of the selected deposition thickness of the reconstructed portion of the hard mask layer.

3. A method for patterning a substrate, the method comprising:
providing a substrate having a dielectric layer disposed over a semiconductor substrate layer;
forming a patterned hard mask layer over the dielectric layer, the patterned hard mask layer exposing a portion of a major surface of the dielectric layer, the patterned hard mask layer comprising a top portion and a bottom portion, the bottom portion comprising a metal-containing hard mask material including titanium nitride, titanium, tantalum nitride, tantalum, ruthenium, tungsten based compounds, or aluminum based compounds, and the top portion comprising a dielectric-containing hard mask material including silicon dioxide, silicon nitride, silicon oxynitride, silicon carbide, carbon doped silicon, or carbon doped silicon oxide; and
performing a concurrent deposition and etch process to remove a portion of the dielectric layer, the concurrent deposition and etch process comprising
removing material from the dielectric layer, and
selectively coating the patterned hard mask layer with hard mask material by selectively depositing material formed from the removing.

4. The method of claim 3, wherein the selectively coating the patterned hard mask layer comprises selectively depositing material with sputtering.

5. The method of claim 3, wherein the selectively coating the patterned hard mask layer comprises selectively depositing material by exposing the substrate to a precursor gas.

6. The method of claim 3, further comprising:
prior to performing the concurrent deposition and etch process, performing a timed etch process for a selected etch time, the timed etch process simultaneously removing a portion of the dielectric layer and a top portion of the patterned hard mask layer, wherein the patterned hard mask layer comprises the top portion and a bottom portion underlying the top portion.

* * * * *